United States Patent
Venkatraman et al.

(10) Patent No.: US 7,019,399 B2
(45) Date of Patent: Mar. 28, 2006

(54) COPPER DIFFUSION BARRIERS MADE OF DIAMOND-LIKE NANOCOMPOSITS DOPED WITH METALS

(75) Inventors: Chandra Venkatraman, Amherst, NY (US); Cyndi L Brodbeck, West Seneca, NY (US); Matthew P. Kirk, Lockport, NY (US)

(73) Assignee: N.V. Bekaert S.A., (BE)

( * ) Notice: Subject to any disclaimer, the term of this patent is extended or adjusted under 35 U.S.C. 154(b) by 0 days.

(21) Appl. No.: 10/466,948

(22) PCT Filed: Jan. 22, 2002

(86) PCT No.: PCT/US02/01697

§ 371 (c)(1),
(2), (4) Date: Jan. 30, 2004

(87) PCT Pub. No.: WO02/058112

PCT Pub. Date: Jul. 25, 2002

(65) Prior Publication Data
US 2004/0124531 A1    Jul. 1, 2004

Related U.S. Application Data

(60) Provisional application No. 60/263,218, filed on Jan. 22, 2001.

(51) Int. Cl.
H01L 23/48      (2006.01)
H01L 23/52      (2006.01)
H01L 29/40      (2006.01)

(52) U.S. Cl. ..................................... 257/751; 257/762
(58) Field of Classification Search ................ 257/751, 257/762
See application file for complete search history.

(56) References Cited

U.S. PATENT DOCUMENTS 5,786,068 A * 7/1998 Dorfman et al. ............ 428/209
6,015,597 A * 1/2000 David ........................ 427/577
6,300,236 B1 * 10/2001 Harper et al. ............... 438/618

OTHER PUBLICATIONS

Venkatraman, C., et al., "Electrical perperties of diamond-like nanocomposite coatings", 1997, Thin Solid Films, Elsevier Science, pp. 173-177.*
"Lithographic Patterns With a Barrier Liner", Mar. 1, 1990, IBM Tech. Dis. Bul. (ITDB), vol. 32 No. 10B, pp. 114-115.*

* cited by examiner

Primary Examiner—Howard Weiss
(74) Attorney, Agent, or Firm—Rogalskyj & Weyand, LLP

(57) ABSTRACT

The invention relatse to a copper diffusion barrier which includes a diamond-like material includes carbon, hydrogen, silicon, oxygen and a metal and is a copper diffusion barrier. Another aspect of the invention relates to an integrated circuit which includes a copper interconnect, a dielectric material and the copper diffusion barrier.

19 Claims, 8 Drawing Sheets

| STRUCTURE | RESONANCE MODE | POSITION (WAVE NUMBERS) |
|---|---|---|
| Si-O-Si RING | Si-O STRETCH | 1060-1080 |
| Si-O-Si CHAIN | Si-O STRETCH; C-O STRETCH | 1020-1080 |
| Si-O | | 800-810 |
| | | |
| Si-(CH3)3 | Si-C DEFORMATION | 1260 |
| Si-(CH3)3 | Si-C STRETCH | 840 |
| Si-(CH3)2 | Si-C DEFORMATION | 1250 |
| Si-(CH3)2 | Si-C STRETCH | 802 AND 888 |
| Si-CH3 | C-H VIBRATION | 1410 |
| -CH3 | C-H STRETCH | 2961 |
| C-H | STRETCH | 2800-3000 |
| Si-H | STRETCH | 2130, 2150-2250 |
| R3 Si-H; WHERE R=CH3-Si-O OR CH3-O | Si-H | 2165 |
| Si-OH OR SiH | | 900 |
| | | |
| Si-OH | BEND | 925-930 |
| -OH | | 3650, 3350 |
| | | |
| Si-CH2-CH2-Si | | 720 |
| Si-CH2-CH2-Si | BENDING | 1400 |
| Si-CH2-CH2-Si | DEFORMATION | 1410 |
| Si-CH2-Si | BENDING | 1200-1260; 1360; 1400 |
| -CH2- (ALKANE) | DEFORMATION | 1463, 2855, 2925 |
| C=O | STRETCH | 1720 |

*FIG. 5*

| WAVENUMBER | PROPOSED STRUCTURE |
|---|---|
| MAJOR PEAKS: | |
| 1026 | Si-O-Si CHAIN |
| 836 | Si(CH3)3 |
| 801 | Si-O OR Si(CH3)2 |
| 1267 | Si(CH3)3 |
| | |
| MINOR PEAKS: | |
| 1400-1410 | Si-CH2-CH2-Si |
| 2120 | Si-H |
| 2961 | -CH3 OR C-H |
| | |
| VERY MINOR OR MISSING PEAKS: | |
| 720 | Si-CH2-CH2-Si |
| 925-930 | Si-OH |
| 1200-1260 | Si-CH2-Si |
| 1360 | Si-CH2-Si |
| 1400 | Si-CH2-CH2-Si OR Si-CH2-Si |
| 1410 | Si-CH3; Si-CH2-CH2-Si |
| 1463, 2885, 2925 | -CH2- (ALKANE) |
| 1720 | C=O |
| 2165 | Si-H OR R3 Si-H, WHERE R=CH3-Si-O OR CH3-O |
| 3650, 3350 | -OH |

*FIG. 6*

COPPER DIFFUSION BARRIERS MADE OF DIAMOND-LIKE NANOCOMPOSITS DOPED WITH METALS

This application claims priority of U.S. Provisional Application No. 60/263,218, filed Jan. 22, 2001, which is hereby incorporated by reference.

FIELD OF THE INVENTION

The subject invention is directed generally to copper diffusion barriers.

BACKGROUND OF THE INVENTION

Throughout this application various publications are referenced. The disclosures of each of these publications in their entireties are hereby incorporated by reference in this application.

One of the primary objectives in semiconductor manufacturing is to produce lower cost integrated circuits (ICs) while at the same time develop devices with higher performance. The major factor affecting the device performance is the signal transmission rate within a device. Signals through metal interconnects are delayed by both the resistance (R) in the metal lines and the capacitance (C) of the inter-metal dielectric (IMD) material. This RC delay can be reduced in circuits by using metals with lower resistance than aluminum and by using low dielectric constant materials to replace $SiO_2$. Copper has emerged as the metal of choice to reduce interconnect resistance. The transition of copper interconnect technology into IC manufacturing is underway.

Although copper interconnects offer advantages in performance, a need exists for an appropriate diffusion barrier/adhesion promoter for the copper interconnects. The conductive barrier materials currently used for aluminum metallization (Ti, TiN, W and nitrided W) have been investigated and found effective in preventing copper diffusion (Braud et. al., Microelectronic Engineering, 33:293 (1997)). Other coatings that have emerged as a suitable barrier for current generation IC circuits are Ta and TaN (Stavrev et al., Microelectronic Engineering 33:269(1997), Min et al., J. of Vacuum Science & Tech. B., 14(5):3263 (1996)). Unfortunately, as feature sizes shrink and aspect ratios increase to meet the microelectronic industries demand for improved device performance, the limitations of plasma vapor deposition (PVD) based Ti/TiN and Ta based liners becomes apparent.

SUMMARY OF THE INVENTION

The present invention relates to a copper diffusion barrier which includes a diamond-like material. The diamond-like material includes carbon, hydrogen, silicon, oxygen and a metal where the diamond-like material is a copper diffusion barrier.

Another aspect of the present invention relates to an integrated circuit which includes a copper interconnect, a dielectric material and a copper diffusion barrier. The copper diffusion barrier includes a diamond-like material which includes carbon, hydrogen, silicon, oxygen and a metal.

BRIEF DESCRIPTION OF THE DRAWINGS

These and other features and advantages of this invention will be evident from the following detailed description of preferred embodiments when read in conjunction with the accompanying drawings in which:

FIG. 5 is a table illustrating FTIR peak ranges and their bonding assignments.

FIG. 6 is a table illustrating an interpretation of an FTIR scan of an embodiment of a dielectric material of the present invention.

DETAILED DESCRIPTION OF THE INVENTION

Figure 1:
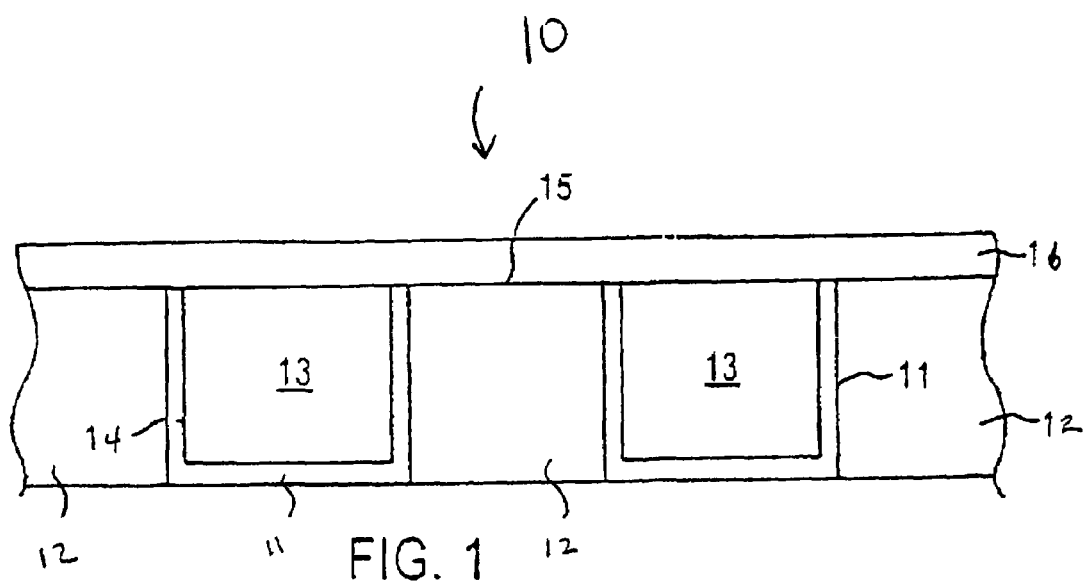
FIG. 1 schematically illustrates a copper interconnect pattern.

The present invention relates to a copper diffusion barrier which includes a diamond-like material. The diamond-like material includes carbon, hydrogen, silicon, oxygen and a metal where the diamond-like material is a copper diffusion barrier.

As used herein, "copper diffusion" refers to the in-line diffusion of copper which occurs between neighboring copper and/or copper alloys lines in semiconductor devices. Therefore, as used herein, "copper diffusion barrier" is defined as a means to prevent copper diffusion between the neighboring copper and/or copper alloy lines.

As used herein, an "interconnect" or "interconnect pattern" refers to a plurality of neighboring copper or copper alloy lines separated by a dielectric material.

As used herein, "conformality" is defined as the uniformity of deposit of a material over a surface of a substrate. For example, a conformal film deposits uniformly over all surfaces of the substrate, i.e., it conforms to the shape of the substrate.

As used herein, "trench structure" is defined as the openings between the dielectric material formed by a conventional damascene technique.

As used herein, "aspect ratio" of the trench structure is defined as the depth of the trench to the width of the trench in the trench structure.

As used herein, "strong copper (111) texture" is defined as copper growth with the (111) preferred crystallographic orientation.

As used herein, "amorphous" refers to a random structure or arrangement of atoms in a solid state that results in no long range regular ordering and no crystallinity or granularity.

As used herein, "low dielectric constant" means a dielectric constant of less than 4.0 as measured using the Hg probe technique at 1 MHz.

As used herein, a "major peak" is defined to mean any peak which has an intensity greater than about 25% of the intensity of the largest peak and a "minor peak" is defined to mean any peak which has an intensity less than about 25% of the intensity of the largest peak.

Copper (and copper alloy) interconnect patterns and copper diffusion barriers are disclosed generally in U.S. Pat. Nos. 6,335,283, 6,329,701 and 6,218,734, which are hereby incorporated by reference.

In a first embodiment of the present invention, the copper diffusion barriers include a diamond-like material which includes carbon, hydrogen, silicon, oxygen and a metal. One example of the diamond-like-material of the present invention is described in U.S. Pat. No. 5,466,431, which is hereby incorporated by reference. The diamond-like material includes a diamond-like carbon network chemically stabilized by hydrogen atoms, and a glass-like silicon network stabilized by oxygen atoms, resulting in an amorphous structure.

The diamond-like material further includes a metal. Examples of desirable metals include Ti, Mo, W, and Ta, with W and Ta being highly desirable.

In addition, in an alternate embodiment, the diamond-like material includes an additional dopant element or dopant compound. The additional dopant is any one or a combination of alkaline earth metals, transition metals and/or nonmetals such as, for example, B, Si, Ge, F, O, Mo, W and Ta.

The carbon content in the diamond-like material of the present invention is greater than about 40 atomic % of the diamond-like material, preferably from about 40 to about 98 atomic %, more preferably from about 50 to about 98 atomic %. Although such materials may theoretically be prepared without any hydrogen, the hydrogen content is preferably at least about 1 atomic % up to about 40 atomic % of the carbon concentration. The sum of the silicon, oxygen and metal is greater than about 2 atomic % of the diamond-like material composition. The metal component is present in an amount of from about 50 atomic % to about 90 atomic % of the diamond-like material with from about 65 atomic % to about 90 atomic % being preferred and from about 75 atomic % to about 90 atomic % being especially preferred. If an additional dopant is added to the diamond-like material, less than 25 atomic % of the material is made of the additional dopant.

In the diamond-like material, the presence of the glass-like silicon-oxygen network serves 1) to prevent the growth of graphitic carbon at high temperatures; 2) to prevent metal cluster formation in metal-(dopant)-containing three network coatings; and 3) to reduce the internal stress in the coating structure and thereby enhance the adhesion to substrates.

The diamond-like material of the present invention is applied, for example, as a coating over a dielectric material prior to depositing a copper film to form a copper interconnect pattern. The diamond-like material operates to prevent copper diffusion between the copper lines of the interconnect pattern.

Another aspect of the present invention relates to an integrated circuit which includes a copper interconnect, a dielectric material and a copper diffusion barrier. The copper diffusion barrier includes a diamond-like material which includes carbon, hydrogen, silicon, oxygen and a metal.

Semiconductor devices and integrated circuits are generally described in U.S. Pat. Nos. 6,180,511, 6,163,060, 6,200, 849, and 6,174,780, which are each hereby incorporated by reference herein.

FIG. 1 illustrates an embodiment of a copper interconnect pattern. Copper interconnect structure 10 includes an interlayer dielectric material 12 in which a plurality of openings 11 are formed. The copper diffusion barrier 14 is deposited lining plurality of openings 11 and along the upper surface 15 of interlayer dielectric material 12. A plurality of copper interconnects 13 are present in openings 11. A dielectric material capping layer 16, which is of the same or of a different material as interlayer dielectric material 12 is deposited over the entire upper surface of 15 of interlayer dielectric material and the upper surface of copper interconnects 13 such that the entire upper surface of copper interconnect structure 10 is covered with capping layer 16.

Copper interconnect structure 10 may also include a dielectric etch stop layer (not shown) formed of, for example, SiC or $Si_3N_4$. In addition, copper interconnect structure 10 includes a substrate (not shown) on which copper interconnect structure 10 is formed. Typical substrates include, for example, silicon substrates, GaAs, CdS, or other substrates known to those skilled in the art.

In one embodiment of the present invention, the copper diffusion barrier includes the diamond-like material of the present invention. In another embodiment of the present invention, the copper diffusion barrier consists essentially of the diamond-like material of the present invention. In another embodiment of the present invention, the copper diffusion barrier consists of the diamond-like material of the present invention.

The copper diffusion barrier of the present invention is conformal. In particular, the copper diffusion barrier of the present invention is conformal where the aspect ratio of the trench structure is from about 2 to about 10. In one embodiment, the conformality of the copper diffusion barrier is greater than 90% over a trench structure having an aspect ration from about 2 to about 10.

The copper diffusion barrier of the present invention results in a copper interconnect which has a strong copper (111) texture. The texturing of the copper deposited on the copper diffusion barriers has a strong correlation with the reliability of the copper lines in copper metalization. In particular, strong copper (111) texture is important to achieving good electromigration resistance and good line reliability.

Figure 2:
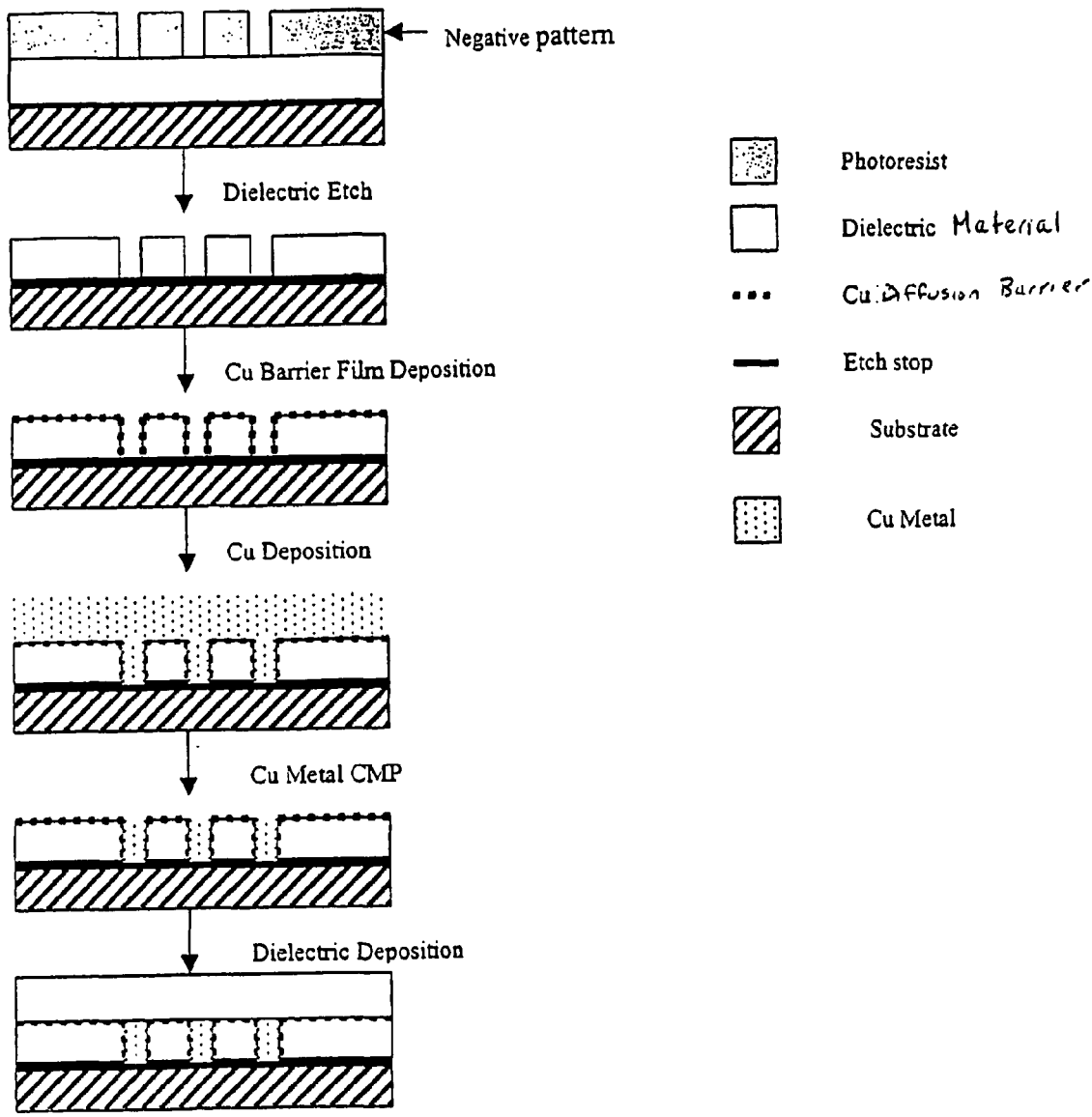
FIG. 2 schematically illustrates a conventional damascene process to produce an embodiment of a copper interconnect pattern.

Copper interconnect structure 10 is formed by, for example but not limited to, a conventional damascene process as shown in FIG. 2. In general, an interlayer dielectric material layer is formed over a substrate. Openings are formed in the interlayer dielectric material by, for example, photolithographic and etching techniques. A copper diffusion barrier is deposited over the exposed surfaces of the interlayer dielectric material and the openings in the interlayer dielectric material are filled with copper or a copper alloy. Chemical-mechanical polishing (CMP) is performed so that the upper surface of the copper lines are substantially coplanar with the upper surface of the interlayer dielectric material. A dielectric material capping layer is deposited over the surface of the copper lines and the upper surface of the copper diffusion barrier. In one embodiment, the above process is repeated to pattern a new layer of the device. In this embodiment, etch stop layers are intermittently deposited to pattern and etch the device.

The copper diffusion barriers are deposited on a substrate (more particularly, on a dielectric material having openings on a substrate) using chemical vapor deposition (CVD) and, more preferably, by plasma enhanced chemical vapor deposition (PECVD).

Figure 3:
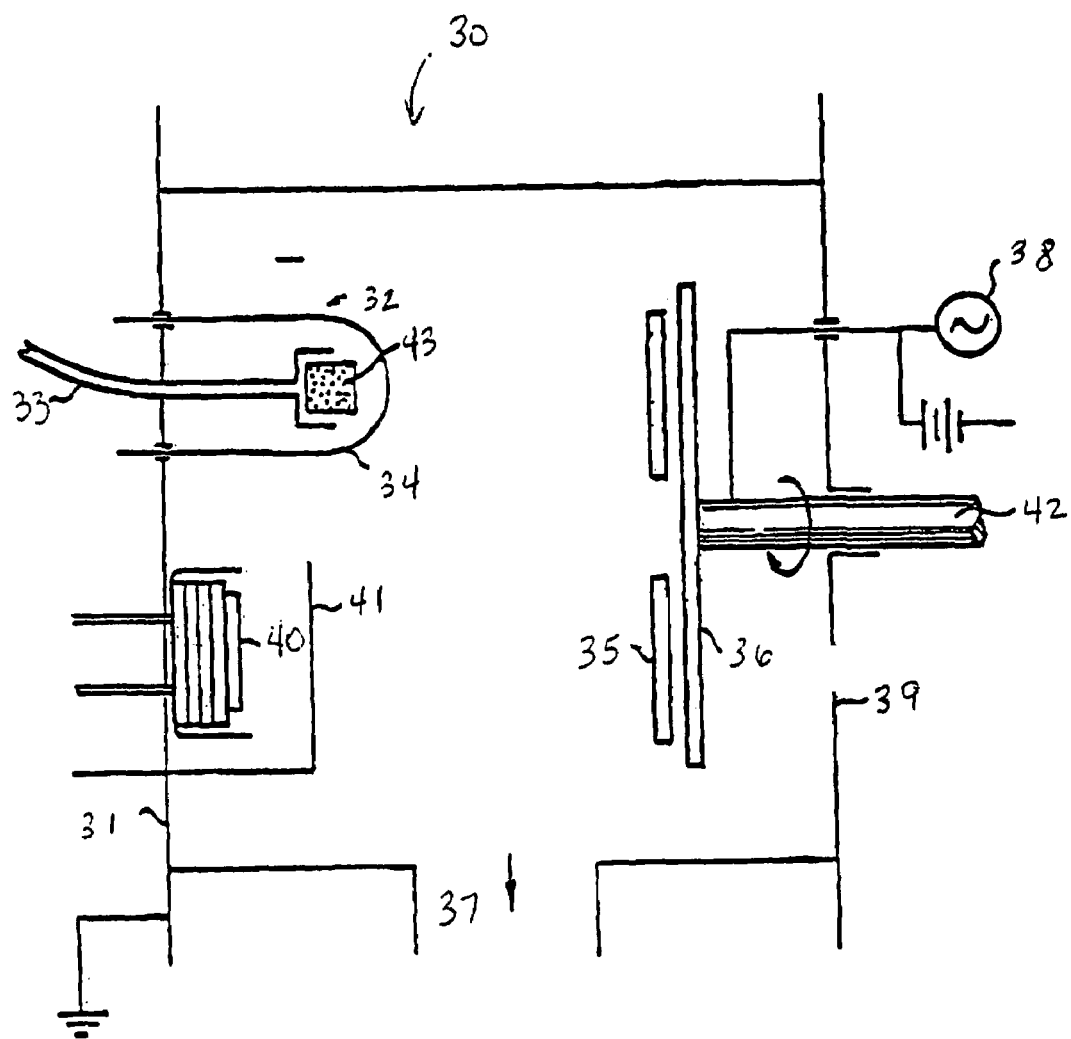
FIG. 3 illustrates an embodiment of a chamber used to deposit materials of the present invention.

FIG. 3 shows one preferred embodiment of the coating chamber used for depositing the copper diffusion barrier material. A vacuum deposition chamber 30 is provided. A precursor inlet system 32, which includes a metal tube 33 and a diffuser head 43 through which a liquid precursor, preferably a polysiloxane, is injected. The precursor inlet system 32 is shown incorporated into the chamber 30 through the chamber base plate 31. The samples are loaded into the chamber through the load lock 39. Disposed within the chamber 30 is a resistively heated tungsten filament 34. Substrates 35 to which the copper diffusion barrier is to be applied are attached to the substrate holder 36. The power supply 38 is used for biasing (DC or RF) substrates 35. Additionally, a power supply (not shown) is used to bias filament 34 and a power supply (not shown) is used to power a magnetron 40. In practice, the system is pumped down using normal vacuum pumpdown procedures. Gate valves (not shown) operably connected to port 37 are closed and the system is backfilled with dry air, nitrogen or argon until the chamber reaches atmospheric pressure. The chamber is then opened and substrates 35 are attached to substrate holder 36 using any fixtures or fastening means including clips, screws, clamps, and masks. Magnetron 40 is used for codeposition of metal and other dopants, and magnetron 40 may be covered by a shutter 41 before deposition is initiated. Substrate holder 36 is designed in a way that it will also hold a cylinder sample (not shown), which, in operation, rotates both about the axis of the central drive shaft 42, and its own axis which is perpendicular to the drive shaft 42.

In use, valves are closed and chamber 30 is backfilled with a gas, such as nitrogen or argon until chamber 30 reaches atmospheric pressure. Chamber 30 is opened and substrates 35 are placed on substrate holder 36. Chamber 30 is evacuated to a base pressure below $10^{-5}$ Torr. The high vacuum is achieved by roughing down the chamber with a mechanical pump followed by pumping with a high vacuum pump through port 7. The pump can be a diffusion pump, turbomolecular pump, cryogenic pump, or other high vacuum pumps known in the field of vacuum technology.

Argon gas is then introduced into the chamber to raise the chamber pressure to $10^{-3}$ Torr to $10^{-4}$ Torr. Substrates 35 are argon ion cleaned inside the deposition chamber before coating.

The argon-ion cleaning is accomplished by either of two methods: glow discharge cleaning or filament assisted plasma cleaning. In glow discharge cleaning, the argon gas is introduced until the chamber pressure is in the $10^{-3}$ Torr range. A glow discharge is excited by RF or DC. During the discharge, a substrate bias of from about 0.03 to about 5.0 kV can be used. The frequency of the RF is in the range of 90–450 kHz. For plasma cleaning, the argon ions are created by a hot filament discharge and the chamber pressure is in the $10^{-4}$ Torr range. The temperature of the filament is in the range of from about 2100° C. to about 2950° C., with a DC filament bias of from about 70 V to about 150 V. The substrates are biased by either RF or DC as mentioned above. Other ion sources known in the field of deposition coating can be used for ion generation, such as, Kauffman type ion sources and RF coil sources. In addition to argon ion etching, other plasma cleaning can be performed by the introduction of small amounts of oxygen gas in addition to the argon gas. This process has been found to efficiently remove hydrocarbon contamination, oxide layers, and other contaminants, as well as improving the adhesion of coatings deposited on some substrates. Typically, cleaning takes place for from about 1 minute to about 30 minutes, with about 15 minutes being most typical.

After the appropriate duration of cleaning, organosilicon precursors, preferably siloxanes which contain C, H, Si, and O are introduced into the chamber through the precursor inlet system. These precursors generally have 1 to 10 silicon atoms. Examples of precursors include hexamethyldisiloxane, tetramethyldisiloxane and polyphenylmethylsiloxane. The precursor is introduced directly into the active plasma region using a microporous ceramic or metallic dispenser which is heated by the hot filament. The precursor can be mixed with other gases, both inert (argon as the feed gas) and active gases such as methane, acetylene, butane, etc. The hot filament photon and electron emission causes fragmentation and ionization of the precursor. The precursor can also be introduced into the system using liquid delivery systems consisting of a flow controller, a heater, and a dispenser as known in the field. In the case of liquid delivery systems, the source of electrons can be a hot filament isolated from the precursor delivery system. Alternatively, the precursor is introduced into the deposition chamber by liquid-to-vapor delivery system. The precursor is flash evaporated into a vapor. A mass flow controller is used to precisely control the flow rate of the precursor vapor. While not required, a mixing gas, such as argon can be used to assist precursor evaporation.

Metal-containing species can be incorporated into the growing films and coatings by many methods: (a) thermal evaporation; (b) ion sputtering; (c) ion beams, (d) magnetron sputtering, etc. The metal beams are directed toward the substrate by the appropriate placement of the sources.

Variations of the above described deposition process include: (a) the use of sputtered silicon and oxygen gas as sources for Si and O; (b) use of solid $SiO_2$ as a source for Si and O; (c) use of $SiH_4$ and oxygen-containing gases as sources for Si; (d) use of a graphite target, hydrogen, and hydrocarbon gases as sources of C and $H_x$; and (e) use of metal-containing organosilicon compounds as sources of C, H, Si, O and metal. Combination of the aforementioned methods may be used. The coating deposition preferably is sustained by a RF capacitively coupled discharge (CCD).

Figure 10:
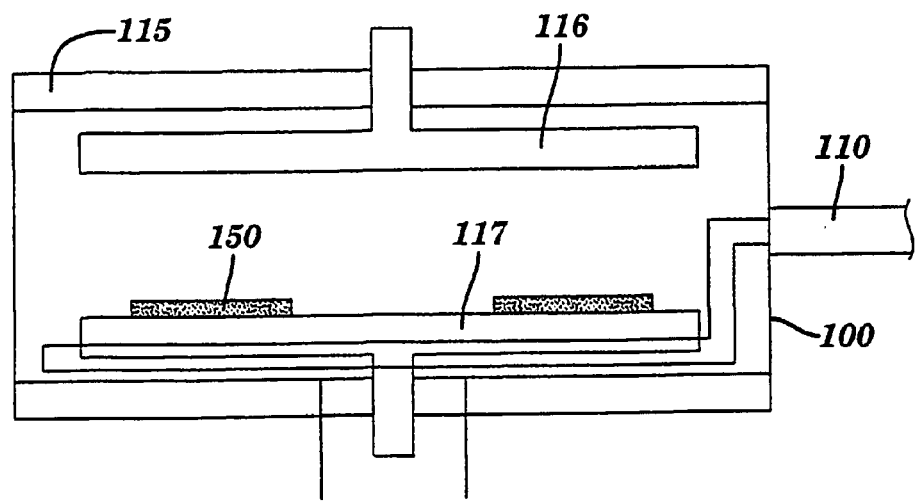
FIG. 10 illustrates an embodiment of a chamber used to deposit materials of the present invention.

In an alternative embodiment, a parallel plate configuration can be used for substrate holders 36 as shown in FIG. 10. In this embodiment, the deposition method for depositing the copper diffusion barrier is as described below for the deposition of a dielectric material having a low dielectric constant.

In an alternative method, a large RF antenna can be placed inside the chamber to excite the discharge. The antenna can be made of copper, stainless steel, or other known state of the art materials. A protective coating, such as porcelain, can be applied to the surface of the antenna to prevent sputtering.

The formation of additional dopant-containing beams may be realized by any one of, or combination of, the following methods: 1) thermal evaporation; 2) ion-sputtering; 3) ion beams; 4) magnetron sputtering and the like. The dopant-containing beams are directed onto the growing film surface through the vacuum chamber. A DC of RF potential is generally applied to the substrates during the deposition process.

No external substrate heating is required, but heating may be used if desired. In one embodiment of the present invention, the temperature of the substrate is about 100° C. In addition, in an alternative embodiment, substrate holder 36 is actively cooled using a closed circuit heat exchanger, if desired.

The coatings required according to the process of the present invention can be carried out in a batch type process for small volumes. In such instance, the substrates are mounted on a substrate holder inside the deposition chamber, the chamber is evacuated, the deposition is performed, and the chamber is vented, followed by removal of the coated substrates. For larger volumes, the process of the present invention can be carried out in an air-to-air system. Such air-to-air system could consist of cleaning, transport of parts to the deposition chamber, and mechanized/robotic loading of the parts on the substrate holder. This is followed by entry of the substrate holder into the load-lock chamber, by entry into the deposition chamber, and coating. The coated parts on the substrate holder can then be removed from the deposition chamber.

In an alternative embodiment of the present invention, the interlayer dielectric material (and/or the dielectric material capping layer) is a dielectric material having a low dielectric constant. For example, the dielectric material is a material including carbon, oxygen, silicon and hydrogen having a dielectric constant of from about 2.1 to about 3.0. In an alternative embodiment, the dielectric material having a low dielectric constant includes where a FTIR scan of the material having a low dielectric constant includes at least two major peaks signifying Si—$CH_3$ bonding.

The dielectric material having a low dielectric constant includes carbon, silicon, oxygen and hydrogen. Argon and/or nitrogen may also be included, preferably in small quantities. The structure of the material having a low dielectric constant is of randomly mixed organic and inorganic groups. The groups may be crosslinked. The groups may be present in a three dimensional matrix. Preferably, the material having a low dielectric constant is formed having a backbone structure made substantially of inorganic Si—O—Si groups with organic side-groups attached to the backbone. The Si—O—Si groups may be cyclic groups connected by inorganic chains to form a ring and chain structure. The inorganic chains may vary in length and composition. Organic side groups are attached to either, or both, the cyclic and chain groups. Alternatively, the material having a low dielectric constant is made of a series of siloxane chains with organic side groups attached. The organic side groups are aliphatic, olefinic and aromatic hydrocarbons. Preferably, the organic side groups are made predominately of methyl groups.

In one embodiment of the material having a low dielectric constant, the carbon content is from about 35 atomic percent of the material having a low dielectric constant to about 80 atomic percent of the material having a low dielectric constant, preferably from about 35 to about 70 atomic percent and more preferably from about 40 to about 60 atomic %. The silicon content of the material having a low dielectric constant may range from about 10 up to about 50 atomic % of the material having a low dielectric constant, with from about 15 to about 45% of the material having a low dielectric constant being preferred and from about 20 to about 35 atomic % being especially preferred. The oxygen content may range from about 10 to about 45 atomic percent of the material having a low dielectric constant, with from about 15 to about 25 atomic % being especially preferred. The hydrogen content of the material having a low dielectric constant is at least 1 atomic % up to about 40 atomic %. Preferably, the ratio of silicon to carbon in the material having a low dielectric constant is approximately 2:1.

The material having a low dielectric constant has a dielectric constant of less than 3.0, with from about 2.1 to about 2.8 being especially preferred and from about 2.1 to about 2.5 being most preferred. A dielectric constant of about 2.0 is generally referred to as an "ultra low dielectric constant". The material is amorphous.

Figure 4:
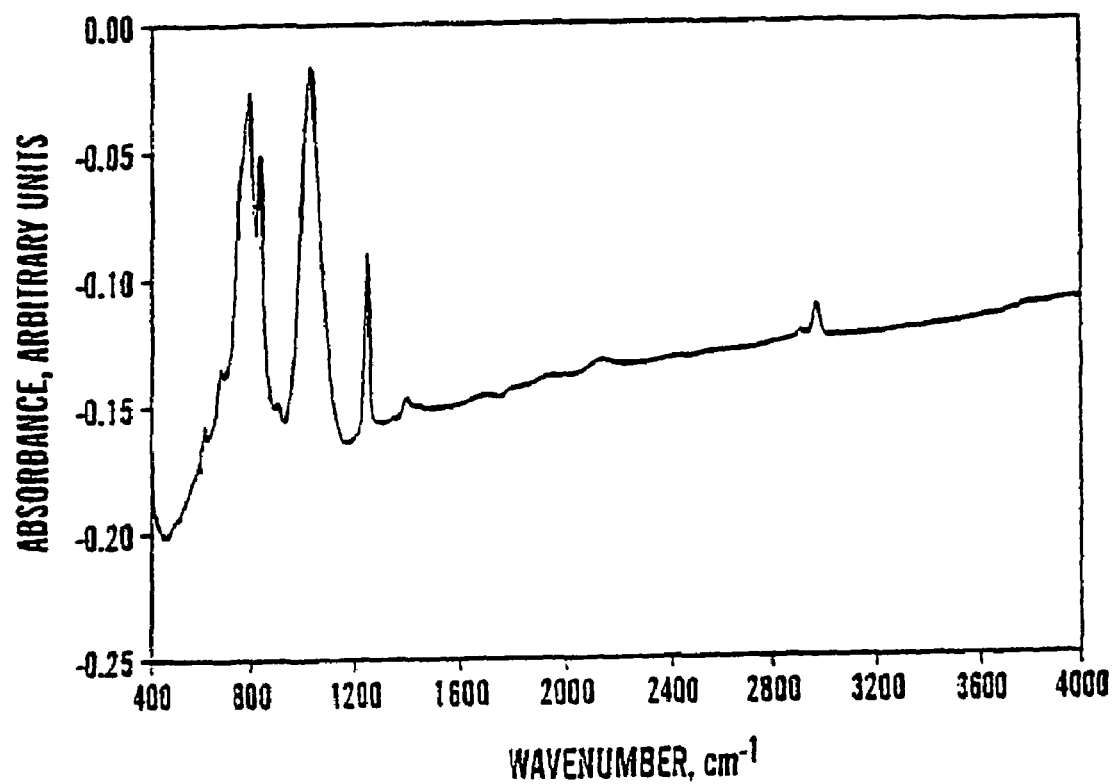
FIG. 4 illustrates a Fourier transform infrared absorption (FTIR) scan showing the composition of one embodiment of a dielectric material of the present invention.

As shown in FIG. 4, a Fourier transform infrared absorption ("FTIR") scan of the material having a low dielectric constant indicates at least two major peaks. As shown in FIG. 5, FTIR peak ranges and their corresponding bonding assignments have been identified (See U.S. Pat. No. 6,068,884, which is hereby incorporated by reference herein). The structure of the dielectric material having a low dielectric constant, as interpreted from the absorption peaks of FIG. 4 and their assignments shown in FIG. 5, is shown in the table of FIG. 6. As shown in FIGS. 4–6, the dielectric material having a low dielectric constant includes Si—O—Si chains, C—H bonds, Si—O bonds, Si—H bonds, Si—C bonds and Si—$CH_3$ bonds. The dielectric material having a low dielectric constant includes predominantly type Si—$CH_3$ bonds. In the FTIR scan of the dielectric material having a low dielectric constant, there are a plurality of major peaks signifying Si—$CH_3$ bonding. One of the major peaks of the dielectric material having a low dielectric constant occurs at wavenumbers from about 835 to about 840 and a second major peak occurs at wavenumbers of from about 1250 to about 1270. As shown in FIG. 6, the major peaks in one embodiment of a dielectric material having a low dielectric constant occur at wavenumber 836 and at wavenumber 1267. As shown in FIGS. 5 and 6, these major peaks correspond to Si—$CH_3$ bonding. In particular, these major peaks correspond to Si—$(CH_3)_3$ bonding. More particularly, the major peak at wavenumber 1267 corresponds to a Si—C deformation resonance mode. The major peak at wavenumber 836 corresponds to a Si—C stretch resonance mode. There exists a correlation between the intensity of the Si—$CH_3$ peak and the dielectric constant of the coating. Typically, as the peak intensity increases, the dielectric constant decreases.

Although not meaning to be bound by theory, it is believed that the dielectric material having a low dielectric constant has inherently low density due to this bonding structure. On an atomic scale, micro sized pores are introduced into the coating by introducing Si—$CH_3$ functional end groups in a C—H and Si—O matrix material, resulting in the stretch bonding structure. Due to these micro pores, the dielectric material having a low dielectric constant has a low density. The low dielectric constant of the material is attributed to this low density. Further, the presence of a large amount of Si—$CH_3$ bonding is directly related to the low dielectric constant.

Other chemical bonds which are present in one embodiment of the dielectric material having a low dielectric constant include C—H at 2910 to 2970 wavenumbers, Si—H at 2120 wavenumbers, C=O at about 1720 wavenumbers, Si—O at about 1020 to about 1080 wavenumbers, Si—O at about 800 wavenumbers and Si—$CH_2$—$CH_2$—Si at about 1400–1410 wavenumbers.

Another aspect of the dielectric material having a low dielectric constant is where the dielectric material has an upper surface and a lower surface and a dielectric constant from about 2.1 to about 4.0, where the dielectric constant of the lower surface is from about 2.1 to about 2.7 and the dielectric constant of the upper surface is greater than 3.0. In this aspect of the invention, the dielectric material having a low dielectric constant is produced such that the dielectric constant of the material is varied through the thickness of the material.

Deposition of the dielectric material having a low dielectric constant of the present invention onto a substrate occurs by chemical vapor deposition and, more preferably, by plasma enhanced chemical vapor deposition.

FIG. 10 shows one preferred embodiment of the chamber used for depositing the dielectric material having a low dielectric constant of the present invention on a substrate to produce a coating. A vacuum deposition chamber 100 is provided to coat the substrates. A precursor inlet system 110 includes a metal tube and a gas distribution ring through which a precursor is injected. Precursor inlet system 110 is shown incorporated into chamber 100 through the sidewall of chamber 100. An alternate arrangement is the introduction of the precursor into chamber 110 from the top 115 of chamber 100 via a gas showerhead (not shown).

Substrates 150 to be coated are loaded into chamber 110 from top 115 of chamber 100 or through a load lock (not shown). Chamber 100 comprises a cylindrical enclosure with a top electrode 116 and a bottom electrode 117 which are in a parallel configuration. High and low frequency power supplies (not shown) are used for biasing either/or both electrodes. Typically, bottom electrode 117 is powered and top electrode 116 is grounded. Although substrates 150 are typically mounted on bottom electrode 117 which is powered, substrates 150 may be mounted on either top electrode 116 or bottom electrode 117 and either top or bottom electrodes 116, 117 may be grounded.

In use, valves (not shown) are closed and chamber 100 is backfilled with a gas, such as nitrogen or argon, until chamber 100 reaches atmospheric pressure. Top 115 of chamber 100 is opened and substrates 150 to be coated are placed on bottom electrode 117 or top electrode 116 using any fixtures or fastening means including clips, screws, clamps, or tape. Alternatively, substrate loading can be performed using cassette loading and robotic arms in a load-lock cluster tool system. Depending on the size of substrates 150, any number can be coated in chamber 100 at a time.

Next, high vacuum is achieved in chamber 100 by roughing down the chamber with a mechanical pump/roots blower pumping system. Other pumping systems, with or without traps, such as a diffusion pump, turbomolecular pump, cryogenic pump, or other high vacuum pumps known in the field of vacuum technology can also be used. The chamber is evacuated to a base pressure from below 1 to about 15 mTorr. Typically, low turbulence vacuum pumping is used to evacuate chamber 100 to minimize particulate matter and debris.

Prior to deposition of the coating, substrates 150 are cleaned inside chamber 100 using any type of ion cleaning, such as plasma cleaning. A cleaning gas is provided to chamber 100 via precursor inlet system 110. Substrate cleaning can be performed with a number of cleaning gases such as argon, oxygen or hydrogen. The choice of the most suitable cleaning gas during cleaning depends on the type of substrate. The cleaning gas flow rates and throttle valve are adjusted to obtain a chamber pressure in the 50 to 500 mTorr range. Preferably, substrate cleaning is performed by RF glow discharge. One or both of electrodes 116 and 117 are powered with a radio frequency ("RF") potential to excite a glow discharge. A RF frequency from about 100 KHz to about 100 MHz is used, with from about 1 Mhz to about 100 MHz being preferred. A power is used from about 50 to about 3000 W, with from about 500 to about 1500 W being preferred. The power density during cleaning ranges from about 40 to about 300. During the RF glow discharge, a substrate bias of from about 0.005 to about 2.0 kV is used. Typically, cleaning takes place for from about 1 minute to about 30 minutes with about 15 minutes being preferred. Other ion sources known in the field of deposition coating such as, Kaufmann type ion source, RF coil, or ECR sources can also be used for ion-generation. The cleaning process efficiently removes hydrocarbon contamination, and other contaminants, as well as improve the adhesion of coatings deposited on substrates 150.

After the appropriate duration for cleaning, precursor is introduced into chamber 100 by liquid-to-vapor delivery system 110. The liquid-to-vapor delivery system is a conventional off-the shelf component known in the field of vacuum technology. The precursor is stored in a reservoir and is delivered to a flash evaporator. A mass flow controller is used to precisely control the flow rate of the precursor liquid through capillary tubing. The capillary tubing delivers the precursor to the evaporator where the precursor is flash evaporated into a vapor. In an alternate arrangement, the liquid precursor can be flash evaporated and then a mass flow controller used to precisely control the flow rate of the precursor vapor. While not required, a mixing gas, such as argon or helium, can be used to assist precursor delivery. Further, additional gases (reactive or inert) including, but not limited to, hydrogen, helium, oxygen, methane, acetylene, butane, and tetrafluoromethane, can be used for altering film properties.

Precursors are organosilicon compounds, preferably siloxanes which contain C, H, Si, and O. The precursors preferably have 1 to 10 silicon atoms. One preferred precursor is hexamethyldisiloxane ("HMDSO"). Other siloxanes and silanes, known in the state of the art, can be used as precursor material. Precursor flow rates of from about 30 to about 75 sccm are preferred. If used, carrier gas and/or additional gas flow rates of from about 30 to about 100 sccm are used.

Alternatively, sputtered silicon and oxygen gas are used as sources of Si and O; solid $SiO_2$ is used as a source for Si and O; $SiH_4$ and oxygen containing gases are used as sources for Si and O; or a graphite target, hydrogen, and hydrocarbon gases are used as sources of C and H. Combination of the these methods may be used.

The coating deposition preferably is sustained by a RF capacitively coupled discharge ("CCD"). During deposition, the precursor reacts and deposits on substrates 150. The RF CCD causes fragmentation and ionization of the precursor (and carrier and additional gases, if present). A pressure of from about 50 to about 600 mTorr is maintained in chamber 100 during the deposition stage. Preferably, the pressure is in the range of 50 to 500 mTorr. Either or both of electrodes 116 and 117 are powered by a RF frequency. The RF frequency applied to substrates 150 is in the range of from about 100 kHz to about 100 MHz, with from about 1 MHz to about 100 MHz being preferred. A power is used from about 50 W to about 3000 W, with from about 50 to about 1000 W being preferred. The power density is from about 40 to about 300 W/ft$^3$, with from about 40 to less than 200 W/ft$^3$ being preferred. The RF potential is about 0.005 to 2.0 kV.

Alternatively, during the deposition stage, the RF potential is applied in pulsed power mode. The frequency of the pulsing ranges from 0.05 to 4 Hz and the duty cycle ranges from 10 to 90%. The power can be pulsed on and off or varied from a higher to lower potential. The preferred mode is to vary the power from high to low power, because this method reduces powder formation in the plasma.

No external substrate heating is used. There is generation of heat due to ion bombardment, causing substrates 150 to heat to a temperature up to 70° C. The substrate holder can be actively cooled using a closed circuit heat exchanger, if desired.

In one embodiment of the invention, a dual electrode configuration is used in chamber 100. Electrode spacing is a parameter in controlling ion bombardment. Larger spacing reduces ion bombardment which, in turn, contributes to the growth of a low density, low dielectric constant coating. An electrode spacing between bottom electrode 117 and top electrode 116 greater than 1 cm is utilized, preferably greater than 5 cm and especially preferred is greater that 7 cm. Alternatively, a single plate configuration can be used.

EXAMPLE

A detailed study of the copper diffusion barrier material properties was undertaken. The properties of conformality, adhesion, copper texture and diffusion barrier properties were examined for the copper diffusion barrier material.

Experimental Set-up

The copper diffusion barrier materials were deposited using a PECVD process, in which a plasma was formed from a siloxane precursor and ionized species were deposited onto biased substrates. Two types of samples were produced, one type was comprised of carbon, silicon, oxygen, hydrogen and titanium (referred to herein as Ti-DLN) the other type was comprised of carbon, silicon, oxygen, hydrogen and tungsten (referred to herein as W-DLN). The two types of materials, both amorphous in microstructure, were deposited on Si. Some of the samples had a $SiO_2$ dielectric material deposited over the Si substrate. The substrates remained at temperatures less than 100° C. during deposition of the copper diffusion barriers. All substrates were cleaned prior to deposition via both wet solvent and in-situ plasma cleaning techniques. The thickness of the deposited copper diffusion barriers was 100 Å, 200 Å and 350 Å.

The integration and diffusion barrier properties of the deposited Ti-DLN and W-DLN materials were evaluated by a variety of analytical methods. Table I lists the specific evaluation items that were investigated and the analytical techniques employed to assess them. PVD TaN films possessing the same thicknesses as the DLN films were used as control samples for the integration tests.

TABLE I

DLN evaluation criteria and analytical techniques utilized

| Evaluation Criteria | Technique Utilized |
| --- | --- |
| Conformality | Focused Ion Beam (FIB) |
| Copper Adhesion | Stud pull test |
| Subsequent Cu Texture | X-ray Diffraction (XRD) |
| Barrier Performance | Rutherford Backscattering Spectrometry (RBS) and/or Triangular Voltage Sweep (TVS) test |

Integration Properties

Figure 7:
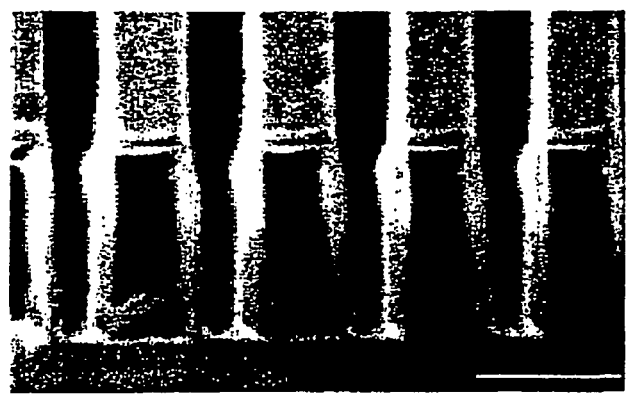
FIG. 7 is a Focused Ion Beam (FIB) image of a copper interconnect of the present invention.

Focused ion beam (FIB) was employed to measure the conformality of a sample barrier layers formed on patterned SiO, dielectric material over Si substrates. FIG. 7 is an FIB image of a 200 Å thick Ti-DLN film showing linear conformality of >90% over the 0.18 μm, aspect ratio 6.5 trench structure. Prior to FIB, the sample was coated with PVD copper to help delineate the barrier layer.

Samples of Ti-DLN material deposited on flat silicon substrates coated with a $SiO_2$ dielectric material were coated with 1000 Å of PVD copper. These samples were analyzed with X-ray diffraction (XRD) to determine subsequent copper texture-and with a computer controlled stud-pull tester to determine the adhesion of the copper to the Ti-DLN films.

Figure 8:
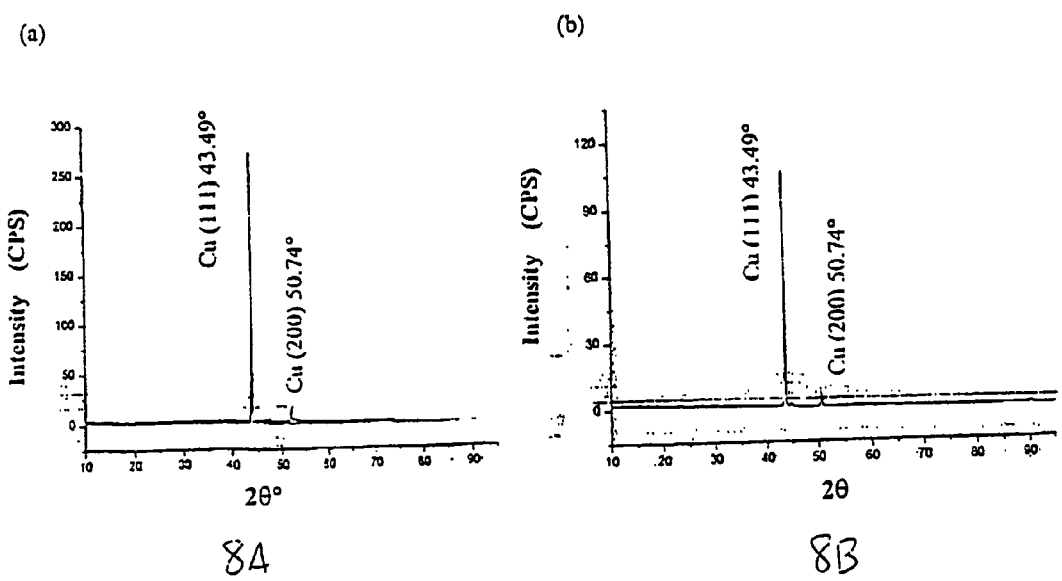
FIGS. 8A–B is an X-ray Diffraction Spectra of one embodiment of a copper interconnect of the present invention (FIG. 8A) compared to an X-ray Diffraction Spectra of a control sample (FIG. 8B).

In general, strong copper (111) texture is vital to achieving good line reliability and electromigration resistance. FIGS. 8a and 8b show XRD spectra of Cu/Ti-DLN/SiO$_2$/Si and Cu/TaN/SiO$_2$/Si stacks, respectively, where the stacks are labeled as Copper/Barrier Layer Composition/Dielectric Material Composition/Substrate Composition. The XRD spectra shows that both the Ti-DLN and TaN liners promote growth of a strongly (111) textured copper microstructure.

Figure 9:
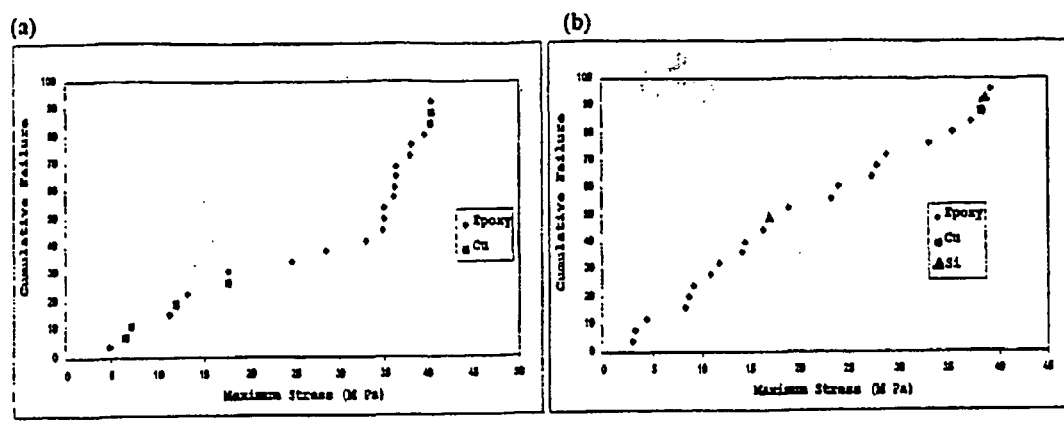
FIGS. 9A–B is an illustration of adhesion failure of one embodiment of a copper interconnect of the present invention (FIG. 9A) compared to a control sample (FIG. 9B).

For the stud-pull adhesion test, studs were epoxied to the film stacks, then cured at 150° C. for two hours. The samples were then loaded face down into the test apparatus and a downward force was applied to the stud. This load was gradually increased until the stud decoupled from the sample. This maximum stress was recorded by the computer and the sample was visually inspected to determine where the failure occurred, i.e. at the epoxy or copper. FIGS. 9a and 9b show the stud-pull histograms for 100 Å thick Ti-DLN and 100 Å thick PVD TaN, respectively. The data shows that although the Ti-DLN stack exhibited a few more failures due to copper delamination than the TaN stack, the overall spread and shapes of the curves are similar.

Diffusion Barrier Properties

The diffusion barrier performance of both Ti-DLN and W-DLN barriers was evaluated over a range of barrier thicknesses. Copper/Copper Barrier/Si stacks were annealed at 550° C. in UHP Argon for 30 minutes. After annealing, the copper was stripped in nitric acid, and the remaining stack analyzed by RBS to detect any copper that may have diffused into the barrier or Si substrate. For comparison, diffusion barrier testing was also performed on a 100 Å thick barrier of TaN. Table II summarizes the results of the diffusion barrier performance of Ti-DLN and W-DLN diffusion barriers.

TABLE II

Diffusion Barrier Performance of Ti-doped and W-doped DLN with different barrier thicknesses.

| Coating Type | Barrier Thickness (Å) | Copper Barrier Test Results |
| --- | --- | --- |
| Ti-DLN | 100 | Fail |
| Ti-DLN | 200 | Fail |
| Ti-DLN | 350 | Pass |
| W-DLN | 100 | Pass |
| W-DLN | 200 | Pass |
| TaN | 100 | Pass |

The RBS spectra of the 100 Å thick W-DLN, both as received and after the thermal anneal, were evaluated. Both spectra were essentially identical, with no sign of Cu diffusion into the barrier material being evident, as there was no peak present near channel 800. The data showed that the W-DLN barriers outperformed the Ti-DLN barriers. The Ti-DLN films required a minimum thickness of 350 Å to act as a barrier to copper diffusion, whereas the W-DLN coatings provided adequate barrier protection at a thickness of 100 Å. The diffusion barrier performance of the W-DLN was comparable to the TaN control sample having the same barrier thickness.

To confirm the thermal diffusion barrier results, the electrical diffusion barrier performance of a 200 Å W-DLN barrier was evaluated using a thermal voltage stress test. For this test, Cu/W-DLN/SiO$_2$/Si stacks were subjected to bias-thermal stressing at 250° C. for 10 minutes. The bias was varied between 1 MV/cm to 2.7 MV/cm. A similarly stressed 250 Å TaN barrier was used as a baseline for these measurements. After stressing, triangular voltage sweep (TVS) was performed by sweeping the bias voltage over the sample from +10 to −40 V, and the C-V curve was measured as this voltage sweep was performed. TVS analysis indicated good barrier performance for bias fields as high as 2.0 MV/cm on 20 nm thick W-DLN film. These results were confirmed using RBS.

CONCLUSIONS

Conductive amorphous Ti-DLN and W-DLN PECVD deposited coatings were evaluated as suitable materials for use as a barrier against copper diffusion. Focused ion beam imaging showed DLN conformality >90% over the 0.18 tm, aspect ratio 6.5 trench structure. Stud pull adhesion testing showed Cu adhesion was comparable to TaN control samples. X-ray diffraction spectra showed that DLN diffusion barriers promoted the growth of strongly (111) texture microstructure. Thermal and electrical diffusion barrier properties were evaluated and the barrier performance of the diffusion barriers was good. These combined results indicate that metal doped DLN films are suitable candidates for use in next generation integrated circuits.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the claims which follow.

What is claimed is:

1. A copper diffusion barrier comprising
a diamond-like material comprising carbon, hydrogen, silicon, oxygen and a metal, wherein the diamond-like material is a copper diffusion barrier and wherein the metal is selected from the group consisting of tungsten, tantalum and titanium and wherein the metal is present in an amount from about 65 to about 90 atomic %.

2. A copper diffusion barrier according to claim 1, wherein the metal is tungsten.

3. A copper diffusion barrier according to claim 1, wherein the metal is tantalum.

4. A copper diffusion barrier according to claim 1, wherein the metal is titanium.

5. A copper diffusion barrier according to claim 1, wherein the copper diffusion barrier is conformal.

6. A copper diffusion barrier according to claim 1, wherein the metal is present in an amount from about 75 to about 90 atomic %.

7. An integrated circuit comprising
a copper interconnect,
a dielectric material and
a copper diffusion barrier comprising a diamond-like material comprising carbon, hydrogen, silicon, oxygen and a metal and wherein the metal is selected from the group consisting of tungsten, tantalum and titanium and wherein the metal is present in an amount from about 65 to about 90 atomic %.

8. An integrated circuit according to claim 7, wherein the metal is tungsten.

9. An integrated circuit according to claim 7, wherein the metal is tantalum.

10. An integrated circuit according to claim 7, wherein the metal is titanium.

11. An integrated circuit according to claim 7, wherein the metal is present in an amount from about 75 to about 90 atomic %.

12. An integrated circuit according to claim 7, wherein the copper interconnect has a strong copper (111) texture.

13. An integrated circuit according to claim 7, wherein the integrated circuit has a trench structure with an aspect ratio of from about 6 to about 10.

14. An integrated circuit according to claim 13, wherein the copper diffusion barrier is conformal.

15. An integrated circuit according to claim 14, wherein the copper diffusion barrier has a conformality of greater than 90%.

16. An integrated circuit according to claim 7, wherein the dielectric layer comprises a material having a low dielectric constant.

17. An integrated circuit according to claim 16, wherein the dielectric material comprises carbon, hydrogen, oxygen and silicon.

18. An integrated circuit according to claim 17, wherein the dielectric material has a dielectric constant of from about 2.1 to about 3.0.

19. An integrated circuit according to claim 18, wherein a FTIR scan of the dielectric material includes at least two major peaks signifying Si—$CH_3$ bonding.

* * * * *